(12) United States Patent
Lu (10) Patent No.: US 11,404,580 B2
(45) Date of Patent: Aug. 2, 2022

(54) DISPLAY PANEL AND DISPLAY DEVICE

(71) Applicant: TCL China Star Optoelectronics Technology Co., Ltd., Shenzhen (CN)

(72) Inventor: Jingyi Lu, Shenzhen (CN)

(73) Assignee: TCL China Star Optoelectronics Technology Co., Ltd., Shenzhen (CN)

(*) Notice: Subject to any disclaimer, the term of this patent is extended or adjusted under 35 U.S.C. 154(b) by 27 days.

(21) Appl. No.: 15/734,813

(22) PCT Filed: Nov. 4, 2020

(86) PCT No.: PCT/CN2020/126343
§ 371 (c)(1),
(2) Date: Dec. 3, 2020

(87) PCT Pub. No.: WO2022/048003
PCT Pub. Date: Mar. 10, 2022

(65) Prior Publication Data
US 2022/0069132 A1  Mar. 3, 2022

(30) Foreign Application Priority Data

Sep. 3, 2020 (CN) .......................... 202010912784.0

(51) Int. Cl.
*H01L 29/786* (2006.01)
(52) U.S. Cl.
CPC .. *H01L 29/78618* (2013.01); *H01L 29/78696* (2013.01)
(58) Field of Classification Search
CPC .................... H01L 29/78618; H01L 29/78696
USPC ............................................................ 257/59
See application file for complete search history.

(56) References Cited

U.S. PATENT DOCUMENTS

2016/0252791 A1  9/2016  Chai
2016/0336351 A1  11/2016  Li et al.

FOREIGN PATENT DOCUMENTS

| CN | 104133332 A |   | 11/2014 |   |   |
|----|-------------|---|---------|---|---|
| CN | 104865763 A |   | 8/2015  |   |   |
| CN | 107991818 A |   | 5/2018  |   |   |
| CN | 111308802 A |   | 6/2020  |   |   |
| CN | 111487820 A | * | 8/2020  | ....... | G02F 1/133707 |
| CN | 111487820 A |   | 8/2020  |   |   |
| CN | 211293540 U |   | 8/2020  |   |   |

* cited by examiner

*Primary Examiner* — Tong-Ho Kim
(74) *Attorney, Agent, or Firm* — Luedeka Neely Group PC (57) ABSTRACT

The present application provides a display panel and a display device. In the display panel, a first channel is divided into the first sub-channel and the second sub-channel, so that a variation in a width of a channel of a first thin film transistor is greater than a variation in a width of a channel of a second thin film transistor, thereby reducing a variation in the impedance ratio between the second thin film transistor to the first thin film transistor, such that a difference in brightness between a secondary pixel in the sub-pixel unit corresponding to the splicing area and a secondary pixel in the sub-pixel unit corresponding to the non-splicing area reduced, thus improving the problem of the uneven brightness of the display panel.

18 Claims, 4 Drawing Sheets

DISPLAY PANEL AND DISPLAY DEVICE

BACKGROUND OF INVENTION

Field of Invention

The present invention relates to the field of display technology, in particular to a display panel and a display device.

Description of Prior Art

With the development of display technology, the requirements for accuracy of a structure size of a thin film transistor in a display panel are getting higher and higher. Especially in a sub-pixel unit including a main pixel and a secondary pixel, the main pixel thin film transistor needs to be used for the main pixel electrode need to be charged and maintains its potential through a main pixel thin film transistor, and the secondary pixel electrode need to be charged through a secondary pixel thin film transistor, while the potential is pulled down by a shared thin-film transistor to ensure that the potential of the secondary pixel is lower than that of the main pixel, thereby obtaining good transmittance and viewing angle. Brightness of the secondary pixel is proportional to the potential of the secondary pixel, and the higher the potential of the secondary pixel, the greater the transmittance of the secondary pixel and the higher the brightness of the secondary pixel. The potential of the secondary pixel is determined by an impedance ratio between the shared thin film transistor and the secondary pixel thin film transistor, and under the premise that other parameters remain unchanged, the impedance ratio between the shared thin film transistor and the secondary pixel thin film transistor is a ratio between a width to length ratio of a cannel of the shared thin film transistor and a width to length ratio of a cannel of the secondary pixel thin film transistor.

Figure 1:
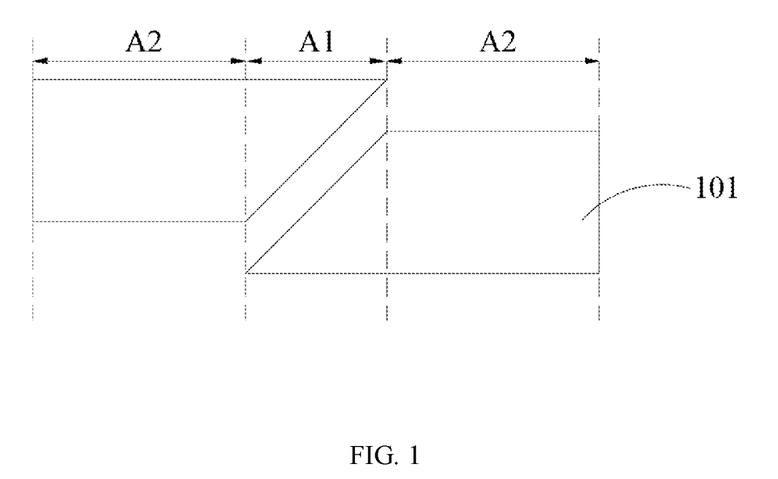
FIG. 1 is a schematic diagram of a lens splicing structure of the exposure machine.

In processes of manufacturing the secondary pixel thin film transistor and the shared thin film transistor, the metal layer needs to be patterned through processes such as exposure, development, and etching to form a source, a drain, and a channel between the source and the drain. At present, in the process of exposure, for example, a Nikon exposure machine with a multi-lens splicing structure is often used to expose a photoresist. As shown in FIG. 1, FIG. 1 is a schematic diagram of the multi-lens splicing structure of the exposure machine. Since exposure of the splicing area A1 where the lenses 101 overlap each other is less than exposure of the non-splicing area A2 of the lens 101, a width between opposite ends of the channel of each of the secondary pixel thin film transistor and the shared thin film transistor corresponding to the splicing area A1 has a variation of $\Delta W$ along a Y-axis direction, and a length of the channel has a variation of $\Delta L$ along the X-axis direction, resulting in a variation of $2\Delta W$ in a total width of the channel of each of the secondary pixel thin film transistor and the shared thin film transistor. At this time, impedance ratios between the shared thin film transistor and the secondary pixel thin film transistor corresponding to the non-spliced area A2 and the spliced area A1 are shown in Equation 1 and Equation 2 as follows: Equation 1: $(Wb/Lb)/(Wa/La)$, Equation 2: $((Wb+2\Delta W)/(Lb+\Delta L))/((Wa+2\Delta W)/(La+\Delta L))$, where Wa is the width of the channel of the secondary pixel thin film transistor, La is the length of the channel, Wb is the width of the channel of the shared thin film transistor, and Lb is the length of the channel. Since the lengths of the channels of the secondary pixel thin film transistor and the shared thin-film transistor are designed the same, and the variations in the lengths of the channels along the X-axis direction are also the same, the impedance ratios between the shared thin-film transistor and the secondary pixel thin film transistor corresponding to the non-spliced area A2 and the spliced area A1 can be simplified as shown in Equation 3 and Equation 4 as follows: Equation 3: $Wb/Wa$, and Equation 4: $(Wb+2\Delta W)/(Wa+2\Delta W)$. Taking the preset width: $\Delta W=-0.3$ μm, Wa=20 μm, and Wb=5 μm as an example, the impedance ratio between the shared thin film transistor and the secondary pixel thin film transistor corresponding to the non-splicing area A2 is: $5/20=0.25$, and the impedance ratio between the shared thin film transistor and the secondary pixel thin film transistor corresponding to the splicing area A1 is: $(5-0.6)/(20-0.6)=0.227$. It can be seen that the impedance ratio between the shared thin film transistor and the secondary pixel thin film transistor corresponding to the splicing area A1 is reduced by 9.2% compared to that corresponding to the non-spliced area A2, which means that the shared thin film transistor corresponding to the splicing area A1 has a higher potential than the non-splicing area A2, and the potential of the secondary pixel in the sub-pixel unit corresponding to the splicing area A1 is higher than the potential of the secondary pixel corresponding to the non-splicing area A2, so that a difference in brightness between the secondary pixel corresponding to the splicing area A1 and the secondary pixel corresponding to the splicing area A2 is relatively large, which causes the problem of uneven brightness of the display panel.

In summary, in the existing display panel, the impedance ratio between the shared thin film transistor and the secondary pixel thin film transistor corresponding to the lens splicing area of the exposure machine is larger than the impedance ratio between the shared thin film transistor and the secondary pixel thin film transistor corresponding to the non-splicing area, resulting in a problem of uneven brightness. Therefore, there is a need to provide a display panel and a display device to alleviate this defect.

SUMMARY OF INVENTION

Embodiments of the present application provide a display panel and a display device, which are used to solve the problem of uneven brightness of the display panel caused by a relative large difference between the impedance ratio between the shared thin film transistor and the secondary pixel thin film transistor corresponding to the lens splicing area of the exposure machine and the impedance ratio between the shared thin film transistor and the secondary pixel thin film transistor corresponding to the non-splicing area.

An embodiment of the present application provides a display panel including a plurality of sub-pixel units disposed in an array in the display panel, wherein each of the sub-pixel units includes at least a main pixel electrode, a secondary pixel electrode, a first thin film transistor connected to the secondary pixel electrode, a second thin film transistor connected to the first thin film transistor, and a third thin film transistor connected to the main pixel electrode, wherein the first thin film transistor includes a first source, a first drain, and a first channel partially disposed between the first source and the first drain, the second thin film transistor includes a second source, a second drain, and a second channel disposed between the second source and the second drain; and wherein the first channel includes a first sub-channel and a second sub-channel, the first sub-channel is disposed between the first source and the first drain, and the second sub-channel is disposed between the first thin film transistor and the second thin film transistor.

According to an embodiment of the present application, each of the sub-pixel units further includes an auxiliary electrode, the auxiliary electrode is connected to the first source, the second source is connected to the first drain, and the second sub-channel is disposed between the auxiliary electrode and the second source.

According to an embodiment of the present application, the third thin film transistor includes a third source, a third drain, and a third channel disposed between the third source and the third drain, the first sub-channel and the third channel are both U-shaped channels, and opening directions of the first sub-channel and the third channel are opposite.

According to an embodiment of the present application, the second sub-channel is a linear channel, and the auxiliary electrode is disposed in parallel with the second source and disposed on a side of the second source away from the second drain.

According to an embodiment of the present application, the second sub-channel is a U-shaped channel, and an opening direction of the second sub-channel is the same as the opening direction of the first sub-channel.

According to an embodiment of the present application, a length of the third channel is equal to each of lengths of the first sub-channel and the second sub-channel, and a sum of widths of the first sub-channel and the second sub-channel is less than or equal to a width of the third channel.

According to an embodiment of the present application, the length of the second sub-channel is equal to a length of the second channel, and the sum of the widths of the first sub-channel and the second sub-channel is greater than a width of the second channel.

According to an embodiment of the present application, the auxiliary electrode is made from a metal layer same as the first source and the first drain.

According to an embodiment of the present application, each of the main pixel electrode and the secondary pixel electrode has a 4-domain structure.

Another embodiment of the present application provides a display device, including a device body and a display panel disposed on the device body, wherein the display panel includes a plurality of sub-pixel units disposed in an array in the display panel, wherein each of the sub-pixel units includes at least a main pixel electrode, a secondary pixel electrode, a first thin film transistor connected to the secondary pixel electrode, a second thin film transistor connected to the first thin film transistor, and a third thin film transistor connected to the main pixel electrode, wherein the first thin film transistor includes a first source, a first drain, and a first channel partially disposed between the first source and the first drain, the second thin film transistor includes a second source, a second drain, and a second channel disposed between the second source and the second drain; and wherein the first channel includes a first sub-channel and a second sub-channel, the first sub-channel is disposed between the first source and the first drain, and the second sub-channel is disposed between the first thin film transistor and the second thin film transistor.

According to an embodiment of the present application, each of the sub-pixel units further includes an auxiliary electrode, the auxiliary electrode is connected to the first source, the second source is connected to the first drain, and the second sub-channel is disposed between the auxiliary electrode and the second source.

According to an embodiment of the present application, the third thin film transistor includes a third source, a third drain, and a third channel disposed between the third source and the third drain, the first sub-channel and the third channel are both U-shaped channels, and opening directions of the first sub-channel and the third channel are opposite.

According to an embodiment of the present application, the second sub-channel is a linear channel, and the auxiliary electrode is disposed in parallel with the second source and disposed on a side of the second source away from the second drain.

According to an embodiment of the present application, the second sub-channel is a U-shaped channel, and an opening direction of the second sub-channel is the same as the opening direction of the first sub-channel.

According to an embodiment of the present application, a length of the third channel is equal to each of lengths of the first sub-channel and the second sub-channel, and a sum of widths of the first sub-channel and the second sub-channel is less than or equal to a width of the third channel.

According to an embodiment of the present application, the length of the second sub-channel is equal to a length of the second channel, and the sum of the widths of the first sub-channel and the second sub-channel is greater than a width of the second channel.

According to an embodiment of the present application, the auxiliary electrode is made from a metal layer same as the first source and the first drain.

According to an embodiment of the present application, each of the main pixel electrode and the secondary pixel electrode has a 4-domain structure.

Still another embodiment of the present application also provides a display device, including a device body and a display panel disposed on the device body, wherein the display panel includes a plurality of sub-pixel units disposed in an array in the display panel, wherein each of the sub-pixel units includes at least a main pixel electrode, a secondary pixel electrode, a first thin film transistor connected to the secondary pixel electrode, a second thin film transistor connected to the first thin film transistor, and a third thin film transistor connected to the main pixel electrode, wherein the first thin film transistor includes a first source, a first drain, and a first channel partially disposed between the first source and the first drain, the second thin film transistor includes a second source, a second drain, and a second channel disposed between the second source and the second drain; and wherein each of the sub-pixel units further includes an auxiliary electrode, the auxiliary electrode is connected to the first source, the second source is connected to the first drain, and the second sub-channel is disposed between the auxiliary electrode and the second source.

According to an embodiment of the present application, the third thin film transistor includes a third source, a third drain, and a third channel disposed between the third source and the third drain, the first sub-channel and the third channel are both U-shaped channels, and opening directions of the first sub-channel and the third channel are opposite.

Beneficial effects of the embodiments of the present disclosure: in the embodiments of the present application, the first channel of the first thin film transistor is divided into the first sub-channel and the second sub-channel, so that, in a sub-pixel unit, a variation in a width of the channel of the first thin film transistor corresponding to the lens splicing area of the exposure machine is greater than a variation in a width of the channel of the second thin film transistor, thereby reducing a variation in the impedance ratio between the second thin film transistor to the first thin film transistor, such that a difference between a potential of the secondary pixel electrode corresponding to the splicing area and a potential of the secondary pixel electrode corresponding to the non-splicing area is reduced, thereby reducing a difference in brightness between the secondary pixel in the sub-pixel unit corresponding to the splicing area and the secondary pixel in the sub-pixel unit corresponding to the non-splicing area, thus improving the uneven brightness of the display panel.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals.

The disclosure will be further described below in conjunction with the drawings and specific embodiments.

Figure 2:
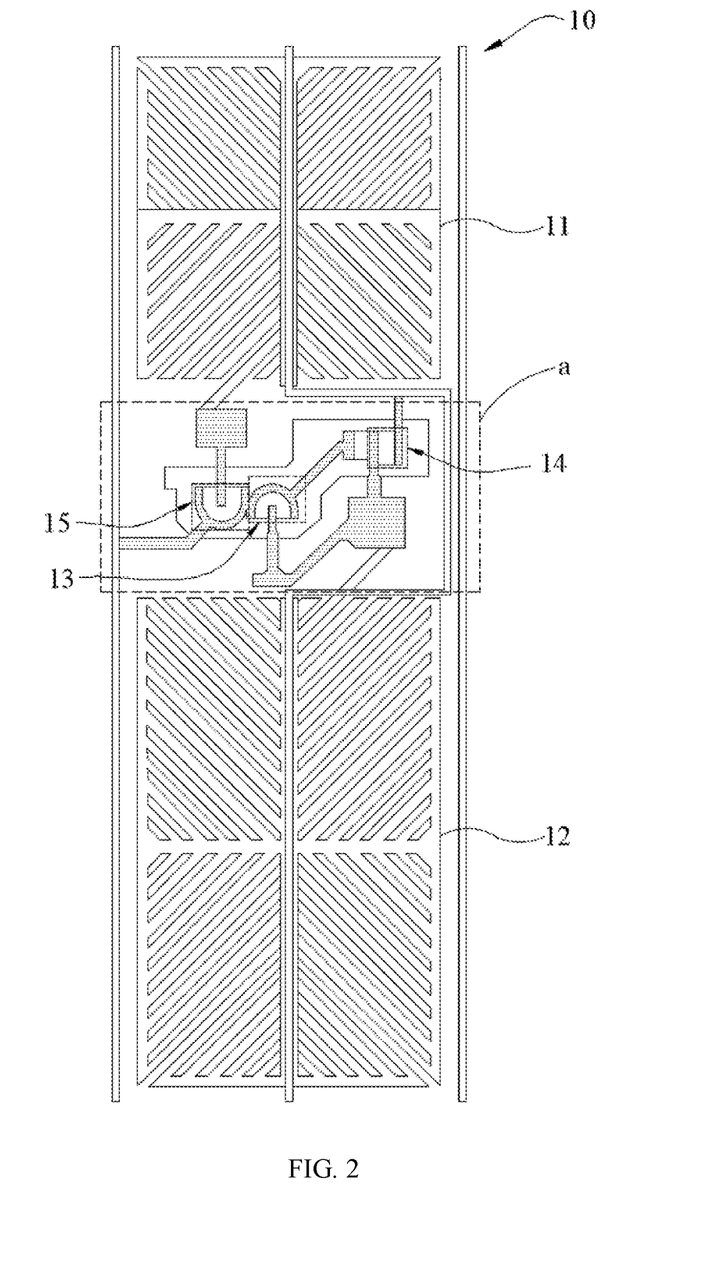
FIG. 2 is a schematic diagram of a first structure of a sub-pixel unit provided by an embodiment of the application.

An embodiment of the present application provides a display panel, as shown in FIG. 2, which is a schematic structural diagram of a sub-pixel unit provided in an embodiment of the present application. The display panel includes a plurality of sub-pixel units 10 arranged in an array in the display panel. Each of the sub-pixel units 10 includes a main pixel and a secondary pixel. The main pixel includes a main pixel electrode 11, the secondary pixel includes a secondary pixel electrode 12, and each of the main pixel electrode 11 and the secondary pixel electrode 12 has a 4-domain structure. The sub-pixel unit 10 at least further includes a first thin film transistor 13 connected to the secondary pixel electrode 12, a second thin film transistor 13 connected to the first thin film transistor 13, and a third thin film transistor 15 connected to the main pixel electrode 11.

Figure 3:
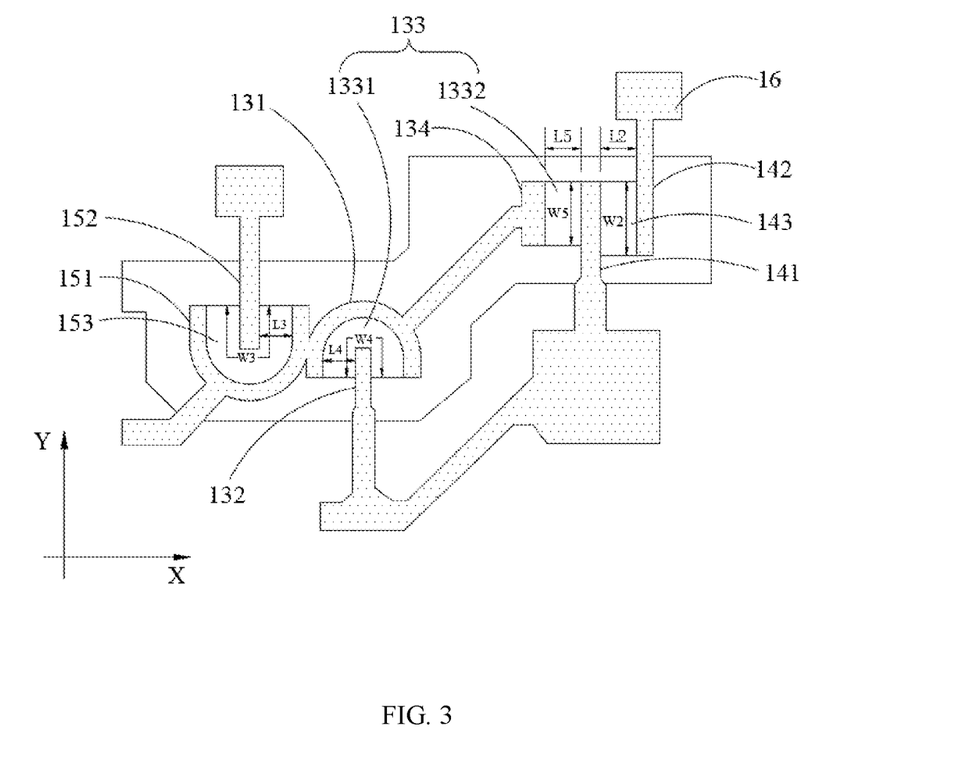
FIG. 3 is an enlarged schematic diagram of the part a in FIG. 2.

As shown in FIG. 3, FIG. 3 is an enlarged schematic view of the part a in FIG. 2. The first thin film transistor 13 includes a first source 131, a first drain 132, and a first channel 133 partially disposed between the first source 131 and the first drain 132, the second thin film transistor 14 includes a second source 141, a second drain 142, and a second channel 143 disposed between the second source 141 and the second drain 142. The channel 143 is provided with a second semiconductor layer (not shown). The first channel 133 includes a first sub-channel 1331 and a second sub-channel 1332. The first sub-channel 1331 is located between the first source 131 and the first drain 132. The first sub-channel 1331 is provided with a first sub-semiconductor layer, the second sub-channel 1332 are located between the first thin film transistor 13 and the second thin film transistor 14, and the second sub-channel 1332 is provided with a second sub-semiconductor layer (not shown).

In the display panel provided by an embodiment of the present application, the first channel 133 is composed of a first sub-channel 1331 and a second sub-channel 1332. Each of the first sub-channel 1331 and the second sub-channel 1332 two openings extending in a Y-axis direction, such that a width W4 of the first sub-channel 1331 and a width W5 of the second sub-channel 1332 of the first thin film transistor 13 corresponding to the lens splicing area A1 of the exposure machine has a variation of 2 ΔW along the Y-axis direction. Compared with the thin film transistor structure of the prior art, the total variation in the width W1 of the first channel 133 of the first thin film transistor 13 corresponding to the splicing area A1 along the Y axis direction is changed from 2ΔW to 4ΔW, and a variation in the width W2 of the second channel 143 of the second thin film transistor 14 along the Y-axis direction is still 2ΔW. At this time, the impedance ratio between the second thin film transistor 14 and the first thin film transistor 13 corresponding to the non-splicing area A2 is: W2/W1, and the impedance ratio between the second thin film transistor 14 and the first thin film transistor 13 corresponding to the splicing area A1 is: (W2+2ΔW)/(W1+4ΔW). Compared with the thin film transistor structure of the existing display panel, in the thin film transistor structure of the display panel provided by an embodiment of the present application, the original amount of variation in the width W2 of the second channel 143 of the second thin film transistor 14 is maintained, and by increasing the variation in the width W1 of the first channel 133 of the thin film transistor 13, the variation in a width ratio of the channels between the second thin film transistor 14 and the first thin film transistor 13 corresponding to the lens splicing area A1 can be reduced, thereby reducing impact on the impedance ratio between the second thin film transistor 14 and the first thin film transistor 13 due to the less exposure of the splicing area A1, and reducing a difference in the potential between the secondary pixel electrode 12 corresponding to the splicing area A1 and the secondary pixel electrode 12 corresponding to the non-splicing area A2. Therefore, a difference in the brightness between the secondary pixels corresponding to the splicing area A1 and the secondary pixels corresponding to the non-splicing area A2 is reduced, and the problem of uneven brightness of the display panel is improved.

In an embodiment of the present application, the sub-pixel unit 10 further includes an auxiliary electrode 134, the auxiliary electrode 134 is connected to the first source 131, the second source 141 is connected to the first drain 132, and the second source 141 is connected to the first drain 132. The second sub-channel 1332 is located between the auxiliary electrode 134 and the second source electrode 141.

Specifically, the third thin film transistor 15 includes a third source 151, a third drain 152, a third channel 153 located between the third source 151 and the third drain 152, and a third semiconductor layer disposed at the third channel 153. The third source 151 is connected to the first source 131 of the first thin film transistor 13, and the third drain 152 is connected to the main pixel electrode 11 for charging the main pixel electrode 11 and maintaining a potential, The first drain electrode 132 of the first thin film transistor 13 is connected to the secondary pixel electrode 12 for charging the secondary pixel electrode 12, and a common electrode 16 is connected to the second drain electrode 142 of the second thin film transistor 14 for pulling down a potential of the secondary pixel electrode 12, to ensure that the potential of the secondary pixel electrode 12 is lower than a potential of the main pixel electrode 11.

In an embodiment of the present application, the first thin film transistor 13, the second thin film transistor 14, and the third thin film transistor 15 are all bottom gate structures, and the gates of the first thin film transistor 13, the second thin film transistor 14, and the third thin film transistor 15 are all disposed in a first metal layer. The auxiliary electrode 134, the first source 131 and the first drain 132 of the first thin film transistor 13, and the common electrode 16 connected to the second drain 142 are all disposed in the second metal layer. Of course, in some embodiments, the first thin film transistor 13, the second thin film transistor 14, and the third thin film transistor 15 may also be in other forms such as a top gate structure, which is not particularly limited here.

The first sub-channel 1331 and the third channel 153 are both U-shaped channels, and opening directions of the first sub-channel 1331 and the third channel 153 are opposite. The first sub-channel 1331 has a U-shaped opening facing the secondary pixel electrode 12, and the third channel 153 has an opening facing the main pixel electrode 11. The second sub-channel 1332 is a linear channel, the auxiliary electrode 134 and the second source 141 are both arranged in parallel with the Y-axis direction, and the second sub-channel 1332 is located at a side of the second source 141 away from the second drain 142.

A length L4 of the first sub-channel 1331 is equal to a length L5 of the second sub-channel 1332, and a sum of a width W4 of the first sub-channel 1331 and a width W5 of the second sub-channel 1332 is the width W1 of the first channel 133. Meanwhile, in order to simplify the difficulty of the process and facilitate the monitoring of the process, a length L2 of the second channel 143 and a length L3 of the third channel 153 are equal to each of lengths of the first sub-channel 1331 and the second sub-channel 1332, and a sum of the widths of the sub-channel 1331 and the second sub-channel 1332 is equal to the width W3 of the third channel 153. In addition, in order to prevent the second thin film transistor 14 from pulling down the potential of the secondary pixel electrode 12 excessively, the sum of the widths of the first sub-channel 1331 and the second sub-channel 1332 should be greater than the width W2 of the second channel 143.

Figure 4:
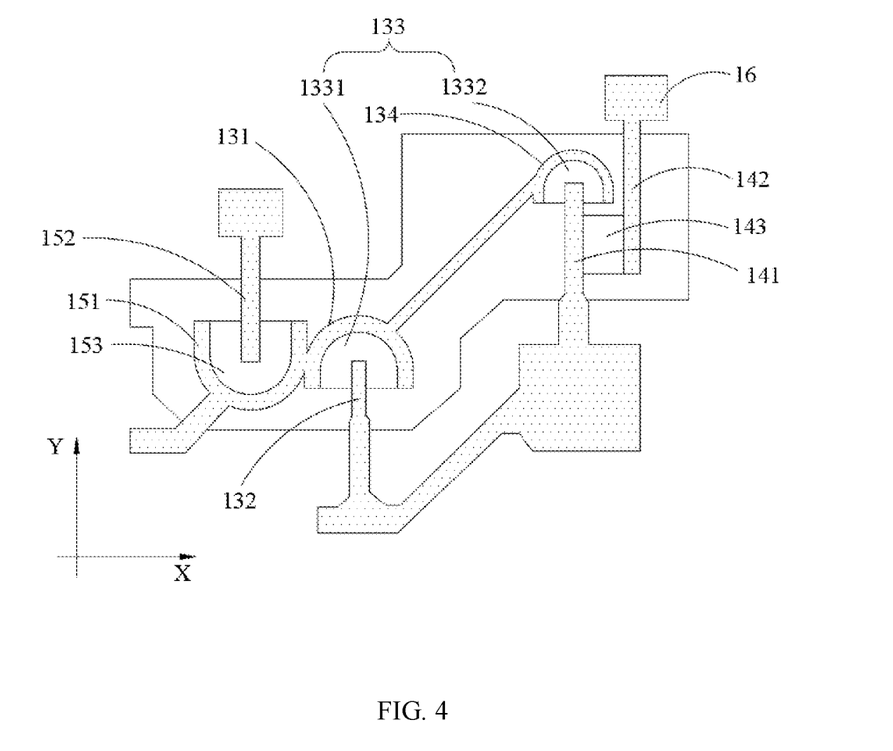
FIG. 4 is a schematic diagram of a second structure of a sub-pixel unit provided by an embodiment of the application.

In some embodiments, as shown in FIG. 4, FIG. 4 is a schematic diagram of the second structure of the sub-pixel unit provided by an embodiment of the application. The second sub-channel 1332 may also be a U-shaped channel, and meanwhile, the first sub-channel 1331 and the third channel 153 are also U-shaped channels. The opening directions of the first sub-channel 1331 and the third channel 153 are opposite, wherein the first sub-channel 1331 has an opening facing the secondary pixel electrode 12, and the third channel 153 has an opening facing the main pixel electrode 11, to ensure that the variation in the width of the second sub-channel 1332 is the same as the variation in the width of the first sub-channel 1331, and the opening directions of the second sub-channel 1332 and the first sub-channel 1331 are the same.

In some embodiments, in order to avoid a decrease in a charging rate of the secondary pixel electrode 12 due to an increased capacitive load caused by the added auxiliary electrode, the thickness of the first metal layer where the gate is located can be appropriately increased to increase the resistance of the gate, such that the influence of the capacitive load in the sub-pixel unit 10 is reduced, and the charging rate of the secondary pixel electrode 12 is ensured.

Taking the preset width: $\Delta W = -0.3$ μm, $W1 = 20$ μm, and $W2 = 6$ μm as an example, the impedance ratio between the second thin film transistor 14 and the first thin film transistor 13 in the sub-pixel unit 10 corresponding to the non-splicing area A2 is: $6/20 = 0.3$, and the impedance ratio between the second thin film transistor 14 and the first thin film transistor 13 in the sub-pixel unit 10 corresponding to the splicing area A1 is: $(6-0.6)/(20-1.2) = 0.287$. The impedance ratio between the second thin film transistor 14 and the first thin film transistor 13 corresponding to the splicing area A1 is reduced by 4.3% compared with the impedance ratio between the second thin film transistor 14 and the first thin film transistor 13 corresponding to the non-splicing area A2, and the reduction in percentage is significantly smaller than the reduction in of the impedance ratio of the display panel in prior art. Therefore, in the display panel provided by an embodiment of the present application, the difference between the potential of the secondary pixel in the sub-pixel unit 10 corresponding to the splicing area A1 and the potential of the secondary pixel in the sub-pixel unit 10 corresponding to the non-splicing area A2 is smaller, thus improving the uneven brightness of the display panel.

TABLE 1

Electrical simulation before and after improvement of the display panel original translation

| | | Before improvement | | After improvement | |
|---|---|---|---|---|---|
| | | non-splicing area | splicing area | non-splicing area | splicing area |
| first thin film transistor | W1/μm | 19.96 | 19.08 | 19.96 | 19.08 |
| | L1/μm | 4.31 | 4.92 | 4.31 | 4.49 |
| second thin film transistor | W2/μm | 5.52 | 4.92 | 6.52 | 5.92 |
| | L2/μm | 4.48 | 4.7 | 4.48 | 4.7 |
| Δ(W2/W1) | | 7.12% | | 5.47% | |
| Charging rate of 255 gray scale | | 84.51% | 84.26% | 84.82% | 85.58% |
| Degree of color shift | | 76.66% | 77.56% | 74.24% | 75.10% |
| Variation in potential of sub-pixel electrode | 255 gray scale | 0.11886 V | | 0.09061 V | |
| | Degree of Mura | Ref | | Improved by 23.8% | |
| | 128 gray scale | 0.06095 V | | 0.04938 V | |
| | Degree of Mura | Ref | | Improved by 19.0% | |

As shown in Table 1, Table 1 is an electrical simulation table provided by embodiments of the application, which respectively provides the electrical simulation results of the display panel provided by the embodiments of the application before and after the improvement. Each data in Table 1 is actual measured data, wherein the first channel of the first thin film transistor of the display panel before the improvement includes only one channel, and the first channel 133 of the first thin film transistor 13 of the display panel after the improvement includes the first sub-channel 1331 and the second sub-channel 1332. Compared with the display panel before the improvement, the preset values of the width W1 and the length L1 of the first channel 133 of the first thin film transistor 13 remain unchanged, and the preset value of the length L2 of the second channel of the second thin film transistor 14 remains unchanged, the preset value of the width W2 of the second channel of the second thin film transistor 14 is increased from 5 μm to 6 μm, and the film thickness of the first metal layer where the gate is located is increased from 0.33 μm to 0.48 μm.

According to the actual measured data in Table 1, the impedance ratio of the second thin film transistor 14 to the first thin film transistor 13 corresponding to the splicing area A1 in the display panel before the improvement has been reduced by 7.12% compared with the impedance ratio of the second thin film transistor 14 to the first thin film transistor 13 corresponding to non-splicing area A2. The impedance ratio between the second thin film transistor 14 and the first thin film transistor 13 corresponding to the splicing area A1 in the display panel after the improvement has been reduced by 5.47% compared with the impedance ratio between the second thin film transistor 14 and the first thin film transistor 13 corresponding to the non-splicing area A2. The variation in the potential of the secondary pixel electrode 12 in the display panel after the improvement has been reduced from 0.1186V before the improvement to 0.09061V. Compared with the display panel before the improvement, the brightness unevenness of the display panel has been reduced by 23.8%. At 128 gray scales, the variation in the potential of the improved secondary pixel electrode 12 has been reduced from 0.06095V before the improvement to 0.04938V, the degree of uneven brightness of the display panel has been reduced by 19%. It can be seen that the variation in the impedance ratio of the second thin film transistor 14 to the first thin film transistor 13 in the sub-pixel unit 10 corresponding to the splicing area A1 in the improved display panel is smaller than the variation in the impedance ratio before the improvement, so that, after the improvement, the difference between the brightness of the secondary pixel in the sub-pixel unit 10 corresponding to the splicing area A1 and the brightness of the secondary pixel in the sub-pixel unit 10 corresponding to the non-splicing area A2 in the display panel is smaller, thereby improving the problem of uneven brightness of display of the display panel.

Beneficial effects of the embodiments of the present disclosure: in the embodiments of the present application, the first channel of the first thin film transistor is divided into the first sub-channel and the second sub-channel, so that, in a sub-pixel unit, a variation in a width of the channel of the first thin film transistor corresponding to the lens splicing area of the exposure machine is greater than a variation in a width of the channel of the second thin film transistor, thereby reducing a variation in the impedance ratio between the second thin film transistor to the first thin film transistor, such that a difference between a potential of the secondary pixel electrode corresponding to the splicing area and a potential of the secondary pixel electrode corresponding to the non-splicing area is reduced, thereby reducing a difference in brightness between the secondary pixel in the sub-pixel unit corresponding to the splicing area and the secondary pixel in the sub-pixel unit corresponding to the non-splicing area, thus improving the uneven brightness of the display panel.

Figure 5:
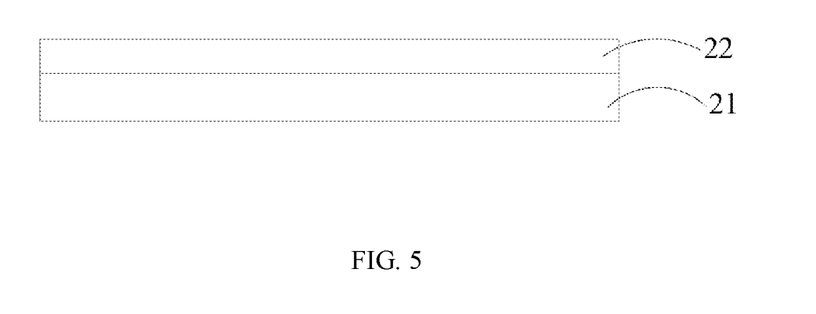
FIG. 5 is a schematic structural diagram of a display device provided by an embodiment of the application.

Based on the display panel provided by the foregoing embodiment, an embodiment of the present application further provides a display device, as shown in FIG. 5, which is a schematic structural diagram of the display device provided by an embodiment of the present application. The display device includes a device body 21 and a display panel 22 arranged on the device body 21. The device body 21 includes a processor, a power supply, a main board, a camera, and a frame assembly for carrying the display panel 22 (not shown). The display panel 22 is the display panel provided in the above embodiments. The display device provided by the embodiment of the present application can achieve the same technical effect as the above-mentioned embodiments, which will not be repeated herein for brevity.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising a plurality of sub-pixel units disposed in an array in the display panel, wherein each of the sub-pixel units comprises at least a main pixel electrode, a secondary pixel electrode, a first thin film transistor connected to the secondary pixel electrode, a second thin film transistor connected to the first thin film transistor, and a third thin film transistor connected to the main pixel electrode, wherein the first thin film transistor comprises a first source, a first drain, and a first channel partially disposed between the first source and the first drain, the second thin film transistor comprises a second source, a second drain, and a second channel disposed between the second source and the second drain;
    wherein the first channel comprises a first sub-channel and a second sub-channel, the first sub-channel is disposed between the first source and the first drain, and the second sub-channel is disposed between the first thin film transistor and the second thin film transistor; and
    wherein each of the sub-pixel units further comprises an auxiliary electrode, the auxiliary electrode is connected to the first source, the second source is connected to the first drain, and the second sub-channel is disposed between the auxiliary electrode and the second source.

2. The display panel according to claim 1, wherein the third thin film transistor comprises a third source, a third drain, and a third channel disposed between the third source and the third drain, the first sub-channel and the third channel are both U-shaped channels, and opening directions of the first sub-channel and the third channel are opposite.

3. The display panel according to claim 2, wherein the second sub-channel is a linear channel, and the auxiliary electrode is disposed in parallel with the second source and disposed on a side of the second source away from the second drain.

4. The display panel according to claim 2, wherein the second sub-channel is a U-shaped channel, and an opening direction of the second sub-channel is the same as the opening direction of the first sub-channel.

5. The display panel according to claim 2, wherein a length of the third channel is equal to each of lengths of the first sub-channel and the second sub-channel, and a sum of widths of the first sub-channel and the second sub-channel is less than or equal to a width of the third channel.

6. The display panel according to claim 5, wherein the length of the second sub-channel is equal to a length of the second channel, and the sum of the widths of the first sub-channel and the second sub-channel is greater than a width of the second channel.

7. The display panel according to claim 1, wherein the auxiliary electrode is made from a metal layer same as the first source and the first drain.

8. The display panel according to claim 1, wherein each of the main pixel electrode and the secondary pixel electrode has a 4-domain structure.

9. A display device, comprising a device body and a display panel disposed on the device body, wherein the display panel comprises a plurality of sub-pixel units disposed in an array in the display panel, wherein each of the sub-pixel units comprises at least a main pixel electrode, a secondary pixel electrode, a first thin film transistor connected to the secondary pixel electrode, a second thin film transistor connected to the first thin film transistor, and a third thin film transistor connected to the main pixel electrode, wherein the first thin film transistor comprises a first source, a first drain, and a first channel partially disposed between the first source and the first drain, the second thin film transistor comprises a second source, a second drain, and a second channel disposed between the second source and the second drain;
 wherein the first channel comprises a first sub-channel and a second sub-channel, the first sub-channel is disposed between the first source and the first drain, and the second sub-channel is disposed between the first thin film transistor and the second thin film transistor; and
 wherein each of the sub-pixel units further comprises an auxiliary electrode, the auxiliary electrode is connected to the first source, the second source is connected to the first drain, and the second sub-channel is disposed between the auxiliary electrode and the second source.

10. The display device according to claim 9, wherein the third thin film transistor comprises a third source, a third drain, and a third channel disposed between the third source and the third drain, the first sub-channel and the third channel are both U-shaped channels, and opening directions of the first sub-channel and the third channel are opposite.

11. The display device according to claim 10, wherein the second sub-channel is a linear channel, and the auxiliary electrode is disposed in parallel with the second source and disposed on a side of the second source away from the second drain.

12. The display device according to claim 10, wherein the second sub-channel is a U-shaped channel, and an opening direction of the second sub-channel is the same as the opening direction of the first sub-channel.

13. The display device according to claim 10, wherein a length of the third channel is equal to each of lengths of the first sub-channel and the second sub-channel, and a sum of widths of the first sub-channel and the second sub-channel is less than or equal to a width of the third channel.

14. The display device according to claim 13, wherein the length of the second sub-channel is equal to a length of the second channel, and the sum of the widths of the first sub-channel and the second sub-channel is greater than a width of the second channel.

15. The display device according to claim 9, wherein the auxiliary electrode is made from a metal layer same as the first source and the first drain.

16. The display device according to claim 9, wherein each of the main pixel electrode and the secondary pixel electrode has a 4-domain structure.

17. A display device, comprising a device body and a display panel disposed on the device body, wherein the display panel comprises a plurality of sub-pixel units disposed in an array in the display panel, wherein each of the sub-pixel units comprises at least a main pixel electrode, a secondary pixel electrode, a first thin film transistor connected to the secondary pixel electrode, a second thin film transistor connected to the first thin film transistor, and a third thin film transistor connected to the main pixel electrode, wherein the first thin film transistor comprises a first source, a first drain, and a first channel partially disposed between the first source and the first drain, the second thin film transistor comprises a second source, a second drain, and a second channel disposed between the second source and the second drain; and
 wherein each of the sub-pixel units further comprises an auxiliary electrode, the auxiliary electrode is connected to the first source, the second source is connected to the first drain, and the second sub-channel is disposed between the auxiliary electrode and the second source.

18. The display device according to claim 17, wherein the third thin film transistor comprises a third source, a third drain, and a third channel disposed between the third source and the third drain, the first sub-channel and the third channel are both U-shaped channels, and opening directions of the first sub-channel and the third channel are opposite.

* * * * *